United States Patent
Schneider et al.

(10) Patent No.: US 7,609,193 B2
(45) Date of Patent: Oct. 27, 2009

(54) METHOD AND SYSTEM FOR A CONFIGURABLE COMMUNICATIONS INTERFACE

(75) Inventors: Gary Schneider, Stony Brook, NY (US); James Giebel, Centerport, NY (US); Peter Fazekas, Bayport, NY (US); Dariusz Madej, Shoreham, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 0 days.

(21) Appl. No.: 11/957,054

(22) Filed: Dec. 14, 2007

(65) Prior Publication Data

US 2009/0153385 A1    Jun. 18, 2009

(51) Int. Cl.
*H03M 1/12* (2006.01)

(52) U.S. Cl. .................................. 341/155; 235/487

(58) Field of Classification Search ......... 341/150–170; 250/208.1; 358/512, 514; 235/462.1, 6, 235/19, 475–487, 380
See application file for complete search history.

(56) References Cited

U.S. PATENT DOCUMENTS

| 5,270,525 | A | * | 12/1993 | Ukai et al. ............ 235/462.16 |
| 5,671,374 | A | | 9/1997 | Postman et al. |
| 5,856,876 | A | * | 1/1999 | Sasanuma et al. ............ 358/300 |
| 6,157,606 | A | * | 12/2000 | Inazawa et al. ............. 369/116 |
| 6,164,540 | A | * | 12/2000 | Bridgelall et al. ....... 235/462.01 |
| 6,209,788 | B1 | * | 4/2001 | Bridgelall et al. ....... 235/462.32 |
| 7,093,763 | B1 | * | 8/2006 | Madej .................... 235/462.27 |
| 7,230,225 | B2 | * | 6/2007 | Tanimoto et al. ......... 250/208.1 |
| 7,256,380 | B2 | * | 8/2007 | Kamisuwa et al. ....... 250/208.1 |
| 7,361,874 | B2 | * | 4/2008 | Nishita et al. ............ 250/201.2 |
| 7,428,995 | B1 | * | 9/2008 | Stern et al. ............. 235/462.01 |
| 2004/0218049 | A1 | | 11/2004 | Silverbrook |
| 2007/0104463 | A1 | | 5/2007 | Ono et al. |

OTHER PUBLICATIONS

International Search Report and the Written Opinion of the International Searching Authority for International Application PCT/US2008/85238, mailed Jan. 30, 2009.

* cited by examiner

*Primary Examiner*—Lam T Mai (57) ABSTRACT

An electronic device having a receiver generating an analog signal from collected image data, a digitizer generating a digital signal from the analog signal and a micro-controller receiving the analog signal and the digital signal and generating a corrected digital signal, wherein the device outputs one of the digital signal and the corrected digital signal.

23 Claims, 5 Drawing Sheets

METHOD AND SYSTEM FOR A CONFIGURABLE COMMUNICATIONS INTERFACE

FIELD OF INVENTION

The present application generally relates to systems and methods for reading a symbol and outputting an un-decoded signal corresponding to the symbol. Specifically, the system and methods provide un-decoded data acquisition devices ("DADs") with high performance digital signal processing ("DSP") benefits without significantly impacting cost or power consumption of the DADs.

BACKGROUND

Devices for scanning bar codes or other symbols may output un-decoded patterns or decoded patterns. Each of these types of scanning devices has benefits and drawbacks. For example, a decoding device may deliver a better image because it has better processing components to process the signal corresponding to the symbol. However, the decoding device may have a high cost and a high power consumption because of the components needed for performance of the processing of the signal. The un-decoded devices may use very little power and may be inexpensive. However, the output of the un-decoded device may not be able to be decoded because certain processing cannot be performed on the un-decoded signal. In addition, because of the lack of processing in the un-decoded devices, certain image reading techniques may not be able to be used, e.g., laser focusing schemes.

SUMMARY OF THE INVENTION

An electronic device having a receiver generating an analog signal from collected image data, a digitizer generating a digital signal from the analog signal and a micro-controller receiving the analog signal and the digital signal and generating a corrected digital signal, wherein the device outputs one of the digital signal and the corrected digital signal.

A method for generating an analog signal from collected image data, generating a digital signal from the analog signal, correcting the digital signal and outputting one of the digital signal and the corrected digital signal.

DETAILED DESCRIPTION

The exemplary embodiments of the present invention may be further understood with reference to the following description of exemplary embodiments and the related appended drawings, wherein like elements are provided with the same reference numerals. The exemplary embodiments of the present invention are related to systems and methods used for reading a symbol and outputting an un-decoded signal corresponding to the symbol. Specifically, the exemplary embodiments provide systems and methods to improve an un-decoded signal that is output from a data acquisition device ("DAD"), such as a laser scanner, a two-dimensional ("2D") imager, etc.

Those skilled in the art will understand that the exemplary embodiments of the present invention are described with reference to a laser scanner scanning a bar code pattern, but that the present invention may also be implemented in conjunction with other types of DADs that output un-decoded signals. Accordingly, the term DAD as used throughout this description refers to any type of device that may capture data corresponding to an image. In addition, the exemplary embodiments of the present invention also may be used in conjunction with other types of symbols (i.e., non-bar code symbols) that may be captured by the DADs. Accordingly, the term symbol refers to any type of image having a pattern or stored data therein.

DADs may be stand alone electronic devices that provide their output via wired or wireless communications with a base device or a networked device or they may be integrated into another type of electronic device such as a mobile computer, a personal digital assistant ("PDA"), a mobile phone, a personal communication device, etc. In either case, the DAD may output a decoded signal or an un-decoded signal. In the case of the DAD outputting decoded signals, the DAD will need relatively expensive processing components that consume a significant amount of power to perform the signal processing needed to decode the raw signal to create the decoded data corresponding to the symbol. In the case of the DAD outputting un-decoded signals, the electronic components needed are relatively simple, inexpensive and do not draw a significant amount of power. The exemplary embodiments of the present invention provide for improved signal processing of the un-decoded signal without significantly impacting the cost or power consumption of the DAD.

Figure 1:
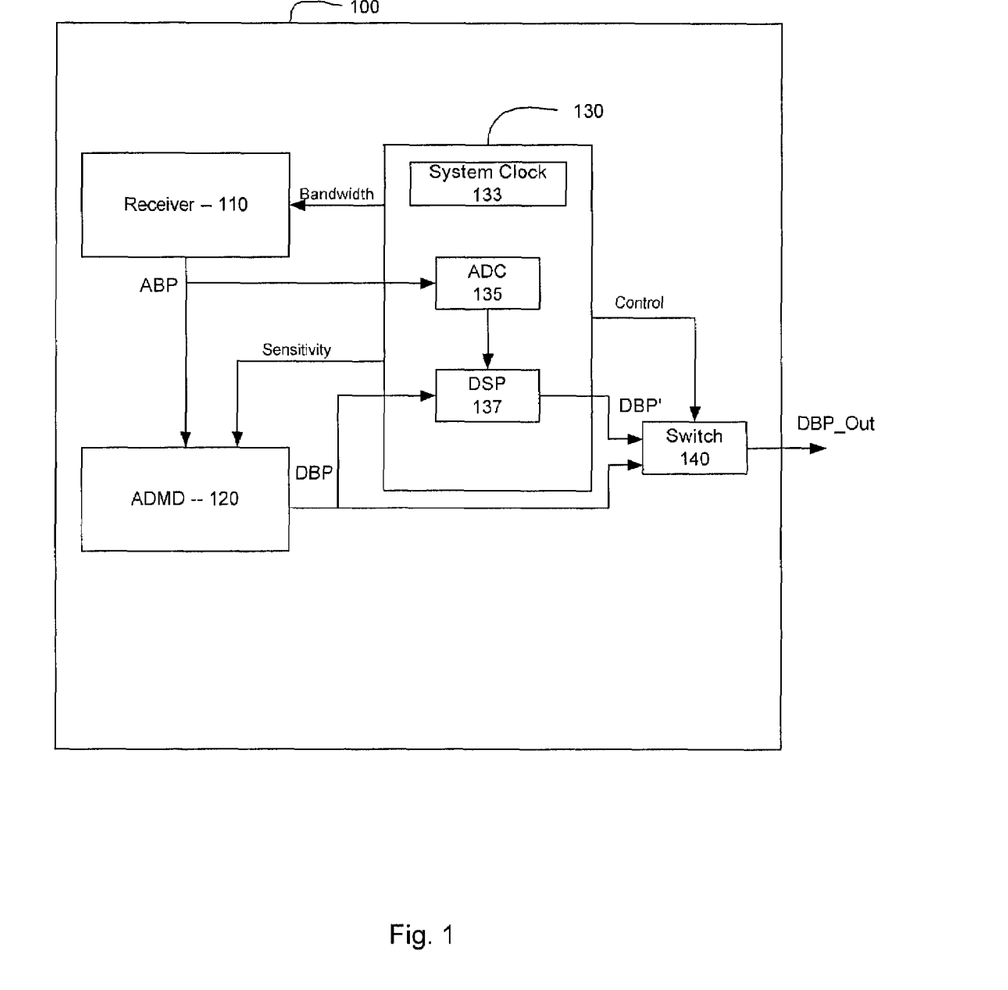
FIG. 1 shows an exemplary data acquisition device according to the present invention.

FIG. 1 shows an exemplary un-decoded DAD 100 including a micro-controller 130 to control the output of the DAD 100. As will be described in greater detail below, the DAD 100 may output a normal digital bar pattern ("DBP") signal from an analog digitizer and margin detector (ADMD) 120 or a corrected DBP signal (labeled DBP') from the micro-controller 130. The micro-controller 130 controls the switch 140 to determine whether the DBP signal or the corrected DBP' signal is output from the DAD 100.

The DAD 100 may operate in the following manner. The receiver 110 receives an analog signal corresponding to the scanned symbol. Those skilled in the art will understand that there may be various means by which the DAD 100 generates the analog signal. In one exemplary embodiment, the DAD 100 may include data capture components not illustrated in FIG. 1 such as a laser light source, an aperture, a lens, a mirror, a detector, an oscillating mirror, a scanning motor and a detector. In this exemplary embodiment, when a user activates the DAD 100, the laser light source generates a light beam along an axis of the lens that travels through the aperture. After passing through the lens, the beam passes through the mirror, and if desired, other lenses or beam shaping structures. The beam then strikes oscillating mirror driven by the scanning motor, which together direct the beam in a scanning pattern as the beam exits through an exit window. The laser light beam is reflected off the symbol to be read (e.g., a bar code) and the reflected beam returns to the DAD 100. The reflected beam may then reflect off the mirror and strike the silvered mirror. The mirror reflects some of the reflected beam into a light responsive detector that converts the reflected light beam into the analog signal. However, those skilled in the art will understand that the present invention may be implemented in a DAD 100 using any manner of capturing the symbol and generating the analog signal.

The receiver 110 may include a programmable noise filter to filter the analog signal. The programmable noise filter may be used because of distortion in the analog signal. The distortion may be caused, for example, by light diffraction when an aperture is used to focus the beam when the DAD 100 is close to the symbol to be read, because of manufacturing tolerances distorting the outgoing scanner light beam, etc. The distortion may cause the beam to have a shape with multiple maxima rather than the desired relatively smooth Gaussian shape. Thus, the programmable noise filter may be employed to smooth the analog signal for further processing. The programmable noise filter may be, for example, a Gaussian filter, a Butterworth filter, a Bessel filter, etc.

The analog signal output of the receiver 110 may be referred to as an analog bar pattern ("ABP") signal. The ABP signal is fed into the ADMD 120. As described above, the DAD 100 may output either an un-decoded DBP signal or a corrected un-decoded DBP' signal depending on the state of the switch 140. The following describes the operation of the ADMD 120 when the output of the DAD 100 is the un-decoded DBP signal, i.e., no additional processing of the DBP signal in the DAD 100. The ABP signal is a time-varying signal whose magnitude is representative of the intensity of the light reflected off successive portions of the symbol. Thus, when the symbol is a bar code, the ABP signal is representative of a pattern of white spaces and black bars of the bar code. Since the scanning velocity is known, the durations of portions of the ABP signal may directly be converted into widths of bar code elements of the bar code. Thus, the ADMD 120 marks where the edges in the ABP signal are located in time.

To generate a digital output, that is, toggling the DBP signal high or low, the ADMD 120 determines when edges in the ABP signal occur that represent transition points between bar code elements, e.g., the end of a bar element and the beginning of a space element or the end of a space element and the beginning of a bar element. A transition point or edge is identifiable as a peak or local maximum in the ABP signal. The ADMD 120 may, for example, utilize an edge detection process to determine when an edge is encountered in the ABP signal. One exemplary process includes the use of edge threshold voltage values. The edge threshold voltage values may be fixed or may change dynamically based on characteristics of the bar code being scanned, lighting conditions, etc. Dynamically changing edge threshold values will be discussed in greater detail below. A transition point in the ABP signal will not be deemed as an edge that results in toggling the DBP signal by the ADMD 120 unless the magnitude of the edge exceeds the appropriate threshold voltage value. That is, the DBP signal will toggle if a positive-going edge exceeds a positive voltage threshold or if a negative-going edge exceeds a negative voltage threshold.

The edge detection process of the ADMD 120 also requires that the edge polarities have to alternate. Edge polarity indicates whether the edge marks a transition from bar to space (negative-going edge or negative edge) or a transition from space to bar (positive-going edge or positive edge). By requiring alternating edges, the edge detection process ensures that the resulting DBP signal represents a sequence of bar code elements that are properly ordered as: bar-space-bar-space-bar-space, etc. As will be described in greater detail below, this is not always the case when digitizing an ABP signal to a DBP signal, but the exemplary embodiments of the present invention handle these irregularities. Thus, the ADMD 120 may receive the ABP signal from the receiver 110 and digitize the ABP signal to create the un-decoded DBP signal that is then output by the DAD 100 when the switch 140 is in the corresponding state for outputting the un-decoded DBP signal.

As described above, the exemplary embodiments of the present invention also include the micro-controller 130 that may be used to provide additional processing of the DBP signal output by the ADMD 120 to produce an un-decoded corrected DBP' signal. The micro-controller 130 may also be used to control the ADMD 120 (e.g., changing thresholds, etc.) and adjust the power consumption of the DAD 100 by adjusting the system clock 133 frequency. Each of these functions will be described in greater detail below.

Figure 2:
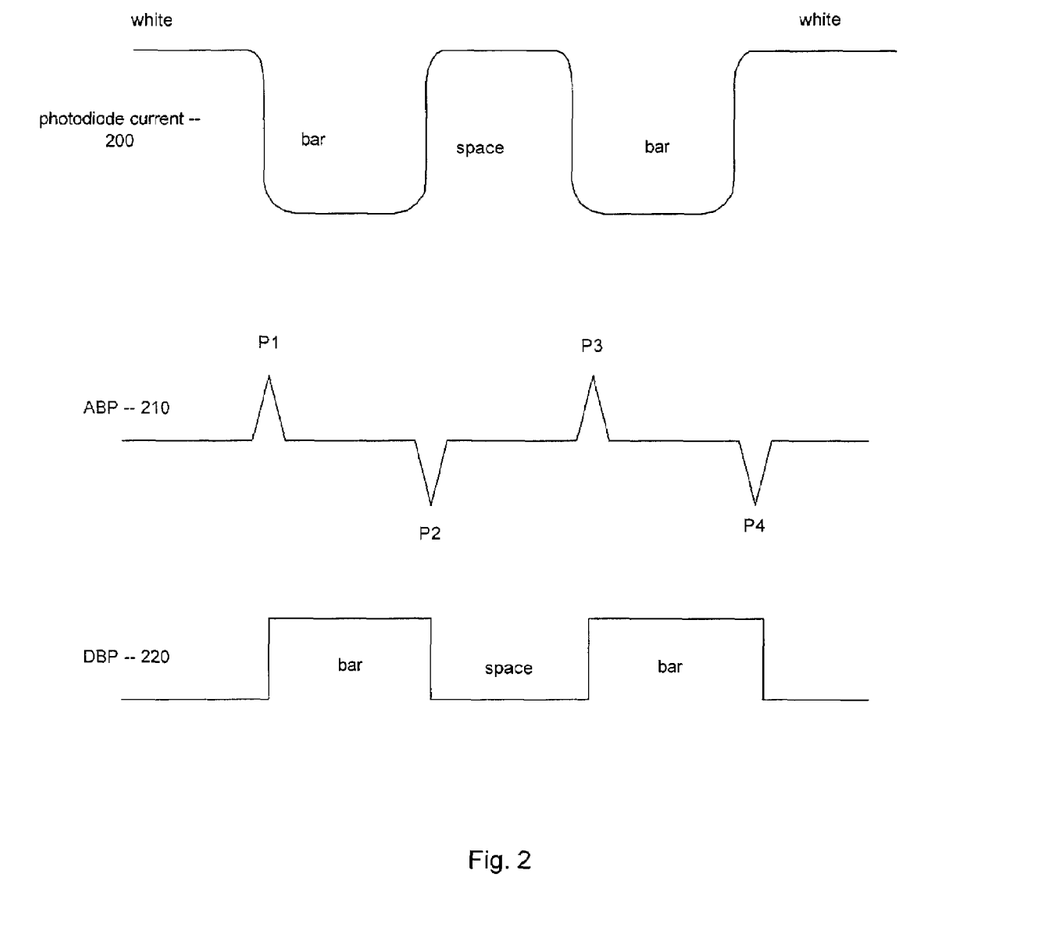
FIG. 2 shows an exemplary photodiode current associated with the scanning of a bar code, a corresponding analog bar pattern (ABP) and a corresponding digital bar pattern (DBP) output by an exemplary data acquisition device according to the present invention.

When the switch 140 is set to the state corresponding to the DAD 100 outputting the corrected DBP' signal, an analog to digital converter ("ADC") 135 of the micro-controller 130 samples peaks at DBP transitions. In one exemplary embodiment, the DAD 100 may also include an analog peak detector (APD) 150 (not shown) that may be used to capture the peaks of each edge within the ABP on an element-by-element basis. For example, FIG. 2 shows an exemplary photodiode current 200 associated with a scanned bar code, a corresponding ABP signal 210 and a corresponding DBP signal 220. It should be noted that in the example of FIG. 2 and the other figures in this description, the ABP signal is an inverted derivative (−dv/dt) of the photodiode current. In the example of FIG. 2, the ABP signal 210 includes positive peak values P1 and P3 (indicating a transition from a space (or white) to a bar) and negative peak values P2 and P4 (indicating a transition from a bar to a space (or white)). In the example of FIG. 2, the ABP signal 210 is generally ideal because there is no noise shown in the signal that is providing false peaks in the ABP signal 210. Thus, each peak corresponds to a true edge of the scanned pattern. However, an ideal ABP signal is very difficult to achieve.

Figure 3:
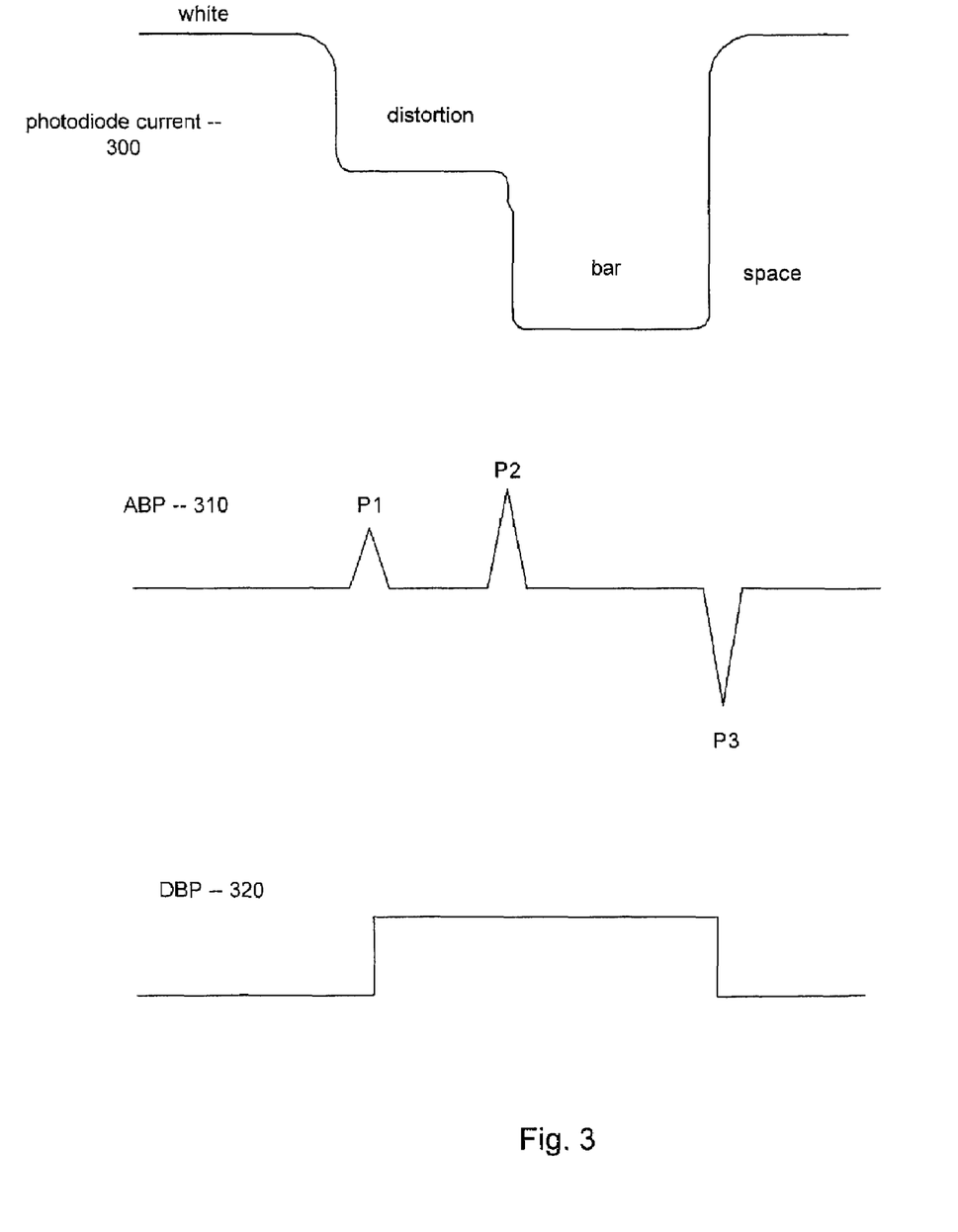
FIG. 3 shows a second exemplary photodiode current associated with the scanning of a bar code, a corresponding ABP and corresponding DBP output by an exemplary data acquisition device according to the present invention.

FIG. 3 shows another exemplary photodiode current 300, a corresponding ABP signal 310 and the corresponding DBP signal 320. In the example of FIG. 3, the ABP signal 310 is not ideal because it shows two consecutive peaks P1 and P2 in the same direction (e.g., positive). However, as described above, the peaks in the ABP signal should alternate between positive and negative to show the transition between the spaces and bars of a bar code. In the example of F*ig*. 3, it may be considered that the peak P2 is the true transition from the space to the bar. However, the corresponding DBP signal 320 shows the peak P1 as the transition because the peak P1 came first in time. Thus, the un-decoded DBP signal 320 does not correspond to the actual bar code that was scanned. When the DBP signal 320 is decoded, the decoder may provide incorrect information because of the transition error included in the DBP signal 320.

Returning to the DAD 100 of FIG. 1, the analog peak detector (APD) 150 may send a portion of the analog ABP signal corresponding to detected peaks in the ABP signal to the ADC 135 of the micro-controller 130. For example, the portions of the ABP signal 310 corresponding to peaks P1-P3 may be input to the ADC 135 to create a digital word that is proportional to each peak's magnitude. A digital signal processing ("DSP") 137 component of the micro-controller 130 receives the output of the ADC 135 and the un-decoded DBP signal from the ADMD 120 and performs additional processing on the un-decoded DBP signal to produce the un-decoded corrected DBP' signal. That is, the DSP 137 may evaluate the edge strength and location information in the signals to determine where the true edges are located in time. The use of the DSP 137 may allow for a slower ADC 135 component. For example, if the ADC 135 component needs to determine the edges of the signal, the ADC 135 component may sample at 10× the information signal. However, by using the DSP 137 to evaluate the edge strength and location, this spares the ADC 135 component from performing this function, thereby allowing for the use of a slower ADC 135 component.

Figure 4:
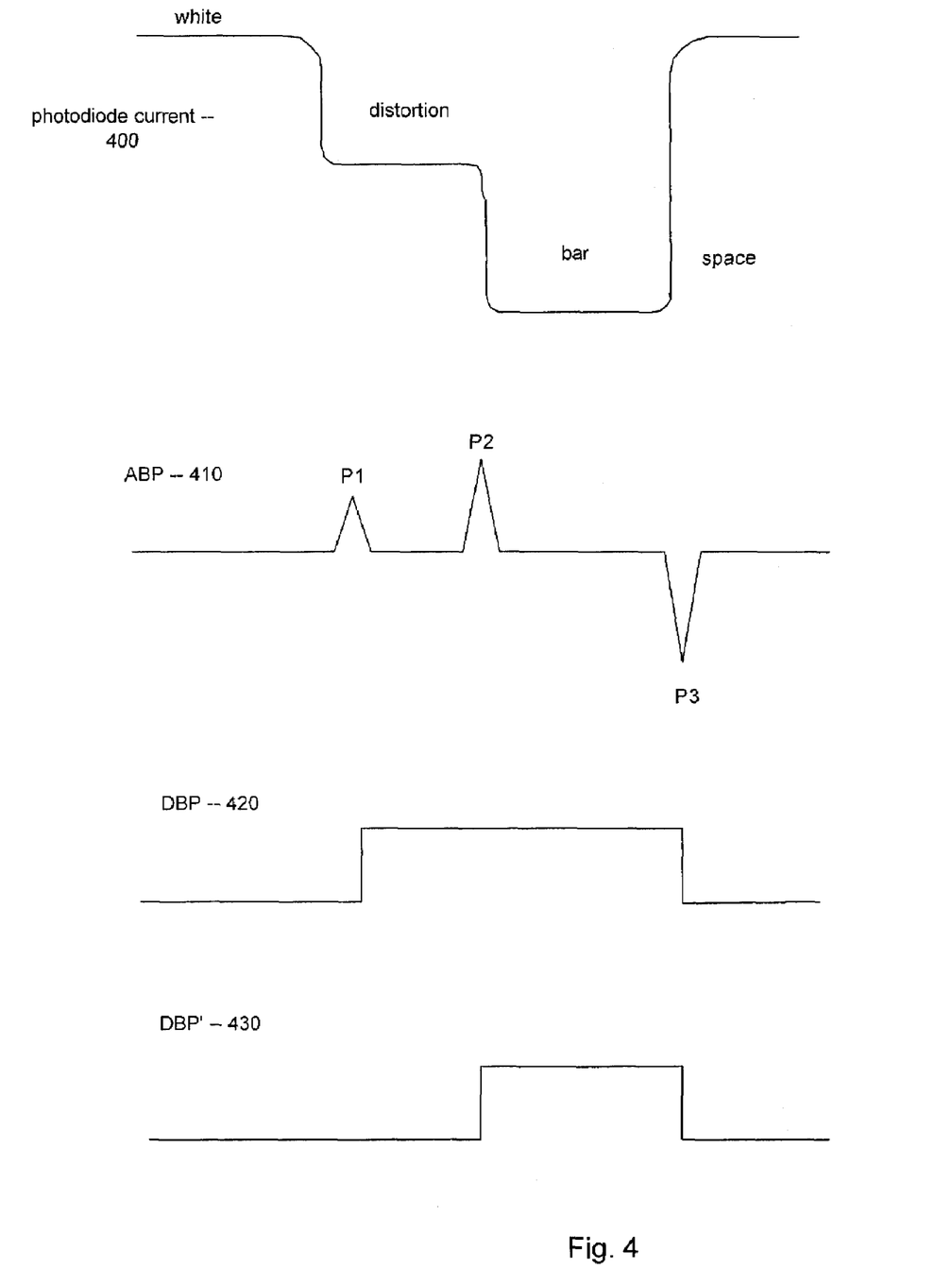
FIG. 4 shows a third exemplary photodiode current associated with the scanning of a bar code, a corresponding ABP, a corresponding DBP and corrected DBP' output by an exemplary data acquisition device according to the present invention.

For example, FIG. 4 shows a photodiode current 400, a corresponding ABP 410, a corresponding DBP signal 420 and a corrected DBP' signal 430. The ABP 410 includes the same deficiency as described above with respect to ABP 310 of FIG. 3, i.e., a false positive peak P1, thereby resulting in a DBP signal 420 having a transition error. However, according to the exemplary embodiments of the present invention, the ADC 135 may provide a digital word corresponding to each of the peaks P1-P3 to the DSP 137. The DSP 137 may compare the peak values P1-P3 to the received DBP signal 420 to determine if the edge transitions in the DBP signal 420 are correct. In this example, the DSP 137 may determine that there are two consecutive peaks P1 and P2 in the same direction. However, the DSP 137 may also determine that the peak P2 has greater amplitude than the peak P1. The greater amplitude of peak P2 indicates that it is the true transition from the space to the edge. Thus, the DSP 137 may adjust the DBP signal 420 to the corrected DBP' signal 430 to indicate the transition at the true position corresponding to the peak P2 in the ABP signal 410.

This situation of false peaks coming earlier in time than the true peaks is common in the examples of a bar code in a high speckle environment, when a laser profile has split beams, and when the barcode itself has defects. However, those skilled in the art will understand that the above described situation may arise from any number of reasons. In addition, the exemplary embodiments of the present invention may also be used to identify and solve other problems associated with an uncorrected DBP signal.

For example, the micro-controller 130 may also be used to adjust other programmable components of the DAD 100. In one exemplary embodiment, the DSP 137 may determine that the error shown in ABP 410 (i.e., consecutive positive peaks) is a systematic error, e.g., the error occurs multiple times in a bar code signal. The micro-controller 130 may send a signal to the ADMD 120 to adjust the threshold voltage (+Vt) to account for the error. That is, if the threshold voltage +Vt is adjusted up, some or all of the false peaks may be eliminated.

There may be situations where detecting edges is difficult and the micro-controller 130 may need to increase the sensitivity of the ADMD 120. This increased sensitivity may minimize edge position error, but may also result in additional false peaks. However, as described above, the exemplary embodiments of the present invention may be used to filter out these false peaks and make corresponding adjustments to the DBP signal to create the corrected DBP' signal. As described above, one manner of filtering out false peaks may be based on a comparison of the amplitude of two consecutive peaks. Other techniques for filtering out false peaks may be based on an absolute value or by comparing relative peak strengths after all the peaks are acquired.

In another example, the micro-controller 130 may also be used to adjust the programmable filter of the receiver 110. For example, the DSP 137 may determine that the receiver bandwidth exceeds the information signal's bandwidth. Thus, the micro-controller 130 may adjust the receiver 110 bandwidth to match the information signal to reduce noise.

The micro-controller 130 may also synthesize the DBP signal into the corrected DBP' signal by compressing the information in time. Information in a bar code is encoded by means of widths of bars and spaces. However it is not absolute widths that carry the information, but relative widths. For example, the ratio of the width of any given element to a narrowest element. Thus, it is possible to generate a first DBP pattern (P1) that is equivalent, from the information content point of view, to a second DBP pattern (P2) which yields the same symbol. However, P2 may be compressed in time, meaning that impulses representing bars and spaces are shorter. For example, the DAD 100 may spew the signal (i.e., the corrected DBP' signal) from a 55 mil bar code scanned from a close distance, as if it were a 5 mil bar code at the end of a reading range. In this manner, a DBP may be delivered faster to a decoder to get faster decode results.

In another exemplary embodiment, the DAD 100 may not include the analog peak detector (APD) 150 to provide the edge peaks to the ADC 135. In such an embodiment, the ADC 135 may continuously sample the received signal (e.g., 10 samples/minimum element). These samples may be placed in a small circular buffer (not shown) and the DSP 137 after each transition in the uncorrected DBP signal may identify where in the waveform the true peak is located. This identification process may be performed in the same manner as described above by corresponding the peaks in the sampled signal to the transitions in the uncorrected DBP signal. This process removes timing errors associated with the ADMD 120 while reducing the burden on the DSP 137 because it only needs to evaluate samples that are close to the DBP transition.

In a further exemplary embodiment, it may also be possible to continuously sample the ABP to collect the entire waveform. Those skilled in the art will understand that continuously may not necessarily mean sampling at all moments in time, but rather sampling continuously during the times of interest, e.g., when it is determined the signal is between the margins of the bar code. This sampling may occur between the margins at a relatively low sampling rate (e.g., 1 sample/narrow element). This entire waveform may then be used to run waveform processing. In such a waveform method, the acquired signal may be processed by software algorithms that can recover information beyond the capabilities of analog hardware digitizers. Those algorithms may generate decodable DBP patterns from signals that are severely distorted by convolution with the laser beam or excessive noise. Exemplary algorithms are described, for example, in U.S. Pat. Nos. 6,328,213 and 7,124,949. Since several different algorithms may be applied to the same input data, each of the algorithms may yield a separate set of DBPs, thus maximizing the chance of decoding.

As described above, the exemplary embodiments of the present invention may also be used to control the power consumption of the DAD 100. For example, the micro-controller 130 may adjust the system clock 133 to reduce the power requirements when the DSP 137 processing is minimal or when the DSP processing 137 is not being used.

Figure 5:
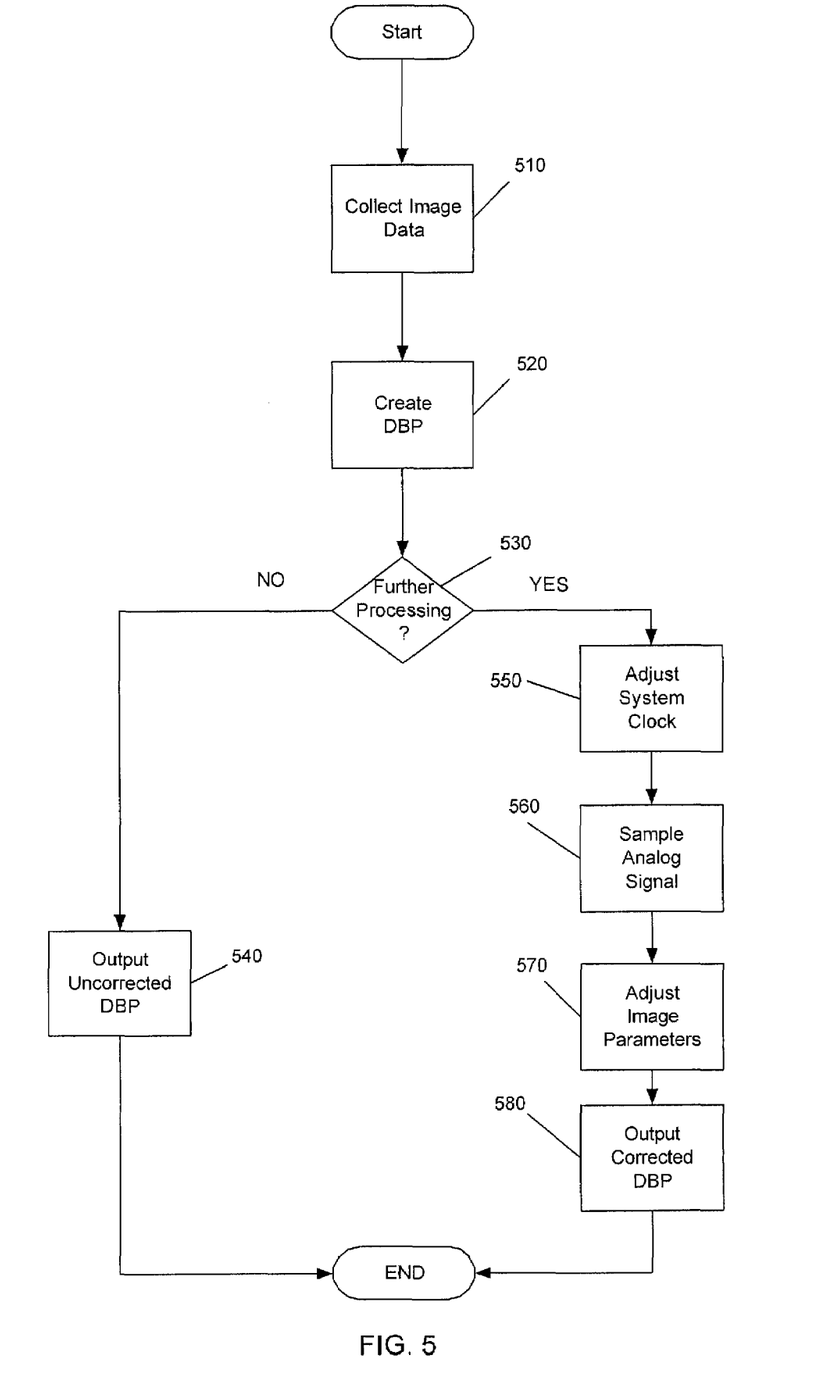
FIG. 5 shows an exemplary method for collecting and outputting data corresponding to a symbol according to the present invention.

FIG. 5 shows an exemplary method 500 for data collection according to the exemplary embodiments of the present invention. The method will be described with reference to the DAD 100 of FIG. 1. In step 510, the DAD 100 will collect the symbol data and the receiver 110 will create the ABP signal corresponding to the collected data. In step 520, the ADMD 120 converts the ABP signal to the uncorrected DBP signal. Initially, the system clock 133 may be in a DBP mode (e.g., a slow clock setting to save power). As will be described below, the system clock 133 speed may be increased to deliver the DBP' output, if needed. In this step 520, the microprocessor 130 may evaluate the signal to noise ratio and the bandwidth of the information signal to adjust the bandwidth of the receiver 110 and/or adjust the sensitivity of the ADMD 120.

In step 530 it is determined whether the DAD 100 will provide additional processing for the DBP signal. The determination of whether additional signal processing is needed may be made in a number of different manners. In one exemplary embodiment, the determination may be made based on a timeout signal, e.g., after twenty (20) scans. For example, if the scanned bar code is not decoded by the host device after a time corresponding to 20 scans by the DAD 100, the DAD 100 may implement the further processing to deliver the DBP' to the host device. The host device may send a signal to the DAD 100 indicating that the bar code has not been decoded after the predetermined time or the host device may merely not turn off the power to the laser scanner or other component of the DAD 100 indicating that the bar code has not been decoded. The DAD 100 may determine, from the fact that it continues to operate, that the further processing may be used. Other manners of indicating that the DAD 100 may implement the further processing may be a signal from the host device, a determination of a particular signal (e.g., a highly speckled signal), etc.

If no additional processing is to be provided (e.g., the switch 140 is in the state corresponding to outputting the uncorrected DBP signal), the DAD 100 outputs the uncorrected DBP signal to the host device in step 540. It should be noted that, while not specifically shown in FIG. 5, the process may loop from step 540 back to step 510 until the bar code is decoded. Continuing with the example from above of a timeout of 20 scans, the uncorrected DBPs associated with the first twenty scans may be output to the host device through step 540. However, at the end of the twenty scans, the process may continue to step 550 (to the process of creating and outputting a corrected DBP' described below) from step 530, rather than back to step 540 to output uncorrected DBPs.

If additional processing is to be carried out on the DBP signal, the method continues from step 530 to step 550 where the micro-controller 130 adjusts the system clock 133 to operate at a faster speed to perform the further processing on the DBP signal. As described above, the default setting of the system clock 133 is the slow clock speed to reduce power consumption. The system clock 133 speed is increased in response to the desire to perform the further processing on the DBP signal to create the corrected DBP'.

In step 560, the ADC 135 samples the ABP signal. As described above, the sampling may be a direct sampling of the ABP signal or may be the input from the analog peak detector (APD) 150 sampling the ABP signal. This sample data and the uncorrected DBP signal are then input into the DSP 137 to perform the further processing in step 570. As described above, the further processing may include correcting the DBP signal to create the corrected DBP' signal and adjusting the other components of the DAD 100 (e.g., the ADMD 120, the receiver 110, etc.). In step 580, the DAD 100 outputs the corrected DBP' signal to a host device.

It should also be noted that, as described above, the micro-controller 130 may also adjust the system clock 133 based on the amount of additional processing that is used to convert the DBP signal to the corrected DBP' signal when additional processing is used.

It will be apparent to those skilled in the art that various modifications may be made in the present invention, without departing from the spirit or the scope of the invention. Thus, it is intended that the present invention cover modifications and variations of this invention provided they come within the scope of the appended claimed and their equivalents.

What is claimed is:

1. An electronic device, comprising:
   a receiver generating an analog signal from collected image data;
   a digitizer generating a digital signal from the analog signal; and
   a micro-controller receiving the analog signal and the digital signal and generating a corrected digital signal, wherein the electronic device selects for output one of the digital signal and the corrected digital signal, wherein the digital signal and the corrected digital signal are an un-decoded digital signal and an un-decoded corrected digital signal, respectively.

2. The device of claim 1, further comprising:
   a switch, wherein a state of the switch corresponds to the output of the one of the digital signal and the corrected digital signal.

3. The electronic device of claim 2, wherein the micro-controller controls the state of the switch.

4. The electronic device of claim 1, wherein the micro-controller includes an adjustable system clock, the micro-controller adjusting the system clock based on the output of the one of the digital signal and the corrected digital signal.

5. The electronic device of claim 1, wherein the micro-controller includes an analog to digital converter (ADC) sampling the analog signal.

6. The electronic device of claim 1, wherein the micro-controller further includes digital signal processing (DSP) components receiving input from the ADC and the digital signal, the DSP components generating the corrected signal.

7. The electronic device of claim 1, wherein the analog signal is an analog bar pattern signal corresponding to a scanned bar code.

8. The electronic device of claim 7, wherein the digital signal corresponding to the analog bar pattern signal is compressed in time.

9. The electronic device of claim 1, wherein the digital signal is a digital bar pattern signal corresponding to a scanned bar code.

10. The electronic device of claim 1, further comprising:
    an analog peak detector (APD) detecting peaks in the analog signal.

11. The electronic device of claim 1, wherein the micro-controller controls settings of other components of the device.

12. The electronic device of claim 11, wherein the settings is one of a sensitivity of the digitizer and a bandwidth of the receiver.

13. The electronic device of claim 1, wherein the analog signal corresponds to a single scan line and the digitizer includes a plurality of digitizers generating a plurality of digital signals corresponding to a number of the plurality of digitizers.

14. A method, comprising:
    generating an analog signal from collected image data;
    generating a digital signal from the analog signal;
    correcting the digital signal; and
    selecting for output one of the digital signal and the corrected digital signal, wherein the digital signal and the corrected digital signal are an un-decoded digital signal and an un-decoded corrected digital signal, respectively.

15. The method of claim 14, further comprising:
    selecting a state of a switch, wherein the state of the switch corresponds to the output of the one of the digital signal and the corrected digital signal.

16. The method of claim 14, further comprising:
adjusting a system clock based on the output of the one of the digital signal and the corrected digital signal.

17. The method of claim 14, wherein correcting the digital signal includes sampling the analog signal.

18. The method of claim 14, wherein the analog signal is an analog bar pattern signal corresponding to a scanned bar code.

19. The method of claim 14, wherein the digital signal is a digital bar pattern signal corresponding to a scanned bar code.

20. The method of claim 14, wherein correcting the digital signal includes detecting peaks in the analog signal.

21. The method of claim 14, further comprising:
setting a sensitivity of a digitizer based on one of the analog signal and the digital signal.

22. The method of claim 14, further comprising:
setting a bandwidth of a receiver based on one of the analog signal and the digital signal.

23. An electronic device, comprising:
a means for generating an analog signal from collected image data;
a means for generating a digital signal from the analog signal;
a means for receiving the analog signal and the digital signal and generating a corrected digital signal, wherein the electronic device selects for output one of the digital signal and the corrected digital signal, wherein the digital signal and the corrected digital signal are an un-decoded digital signal and an un-decoded corrected digital signal, respectively.

* * * * *

UNITED STATES PATENT AND TRADEMARK OFFICE
CERTIFICATE OF CORRECTION

PATENT NO. : 7,609,193 B2
APPLICATION NO. : 11/957054
DATED : October 27, 2009
INVENTOR(S) : Schneider et al.

It is certified that error appears in the above-identified patent and that said Letters Patent is hereby corrected as shown below:

IN THE SPECIFICATION

In Column 5, Line 10, delete "10x" and insert -- 10X --, therefor.

In Column 8, Line 17, in Claim 2, after "The" insert -- electronic --.

Signed and Sealed this

Twenty-fifth Day of May, 2010

David J. Kappos
*Director of the United States Patent and Trademark Office*